United States Patent
Choi et al.

(10) Patent No.: US 10,723,916 B2
(45) Date of Patent: Jul. 28, 2020

(54) ORGANIC FILM CMP SLURRY COMPOSITION AND POLISHING METHOD USING SAME

(71) Applicant: Samsung SDI Co., Ltd., Yongin-si (KR)

(72) Inventors: Jung Min Choi, Uiwang-si (KR); Haruki Nojo, Uiwang-si (KR); Yong Soon Park, Uiwang-si (KR); Yong Sik Yoo, Uiwang-si (KR); Dong Hun Kang, Uiwang-si (KR); Go Un Kim, Uiwang-si (KR); Tae Wan Kim, Uiwang-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 16/100,561

(22) Filed: Aug. 10, 2018

(65) Prior Publication Data
US 2018/0362807 A1 Dec. 20, 2018

Related U.S. Application Data

(62) Division of application No. 14/785,014, filed as application No. PCT/KR2014/003367 on Apr. 17, 2014, now abandoned.

(30) Foreign Application Priority Data

Apr. 17, 2013 (KR) .................. 10-2013-0042551
Apr. 17, 2014 (KR) .................. 10-2014-0045953

(51) Int. Cl.
*C09G 1/02* (2006.01)
*C09G 1/06* (2006.01)
(Continued)

(52) U.S. Cl.
CPC .................. *C09G 1/02* (2013.01); *B24B 1/00* (2013.01); *B24B 37/044* (2013.01); *C09G 1/00* (2013.01);
(Continued)

(58) Field of Classification Search
None
See application file for complete search history.

(56) References Cited

U.S. PATENT DOCUMENTS 5,772,780 A 6/1998 Homma et al.
6,043,155 A 3/2000 Homma et al.
(Continued)

FOREIGN PATENT DOCUMENTS

JP 2004-022748 A 1/2004
JP 2007-138133 A 6/2007
(Continued)

OTHER PUBLICATIONS

International Search Report in counterpart International Application No. PCT/KR2014/003367 dated Jul. 9, 2014, pp. 1-4.
(Continued)

*Primary Examiner* — Jiong-Ping Lu
(74) *Attorney, Agent, or Firm* — Additon, Higgins & Pendleton, P.A.

(57) ABSTRACT

The present invention relates to an organic film CMP slurry composition for polishing an organic film, which includes at least either of a polar solvent or a non-polar solvent and a metal oxide abrasive, is acidic, and has a carbon content of around 50 to 95 atm %, and a polishing method using the same.

20 Claims, 1 Drawing Sheet

(51) Int. Cl.
  *C09G 1/00*      (2006.01)
  *C09K 3/14*      (2006.01)
  *C09K 13/06*     (2006.01)
  *C09G 1/04*      (2006.01)
  *B24B 37/04*     (2012.01)
  *H01L 21/321*    (2006.01)
  *H01L 21/3105*   (2006.01)
  *B24B 1/00*      (2006.01)
  *H01L 21/306*    (2006.01)

(52) U.S. Cl.
  CPC .............. *C09G 1/04* (2013.01); *C09G 1/06* (2013.01); *C09K 3/1454* (2013.01); *C09K 3/1463* (2013.01); *C09K 3/1472* (2013.01); *C09K 13/06* (2013.01); *H01L 21/30625* (2013.01); *H01L 21/31058* (2013.01); *H01L 21/3212* (2013.01)

(56) References Cited

U.S. PATENT DOCUMENTS

| | | | |
|---|---|---|---|
| 6,830,503 | B1 | 12/2004 | Grumbine |
| 7,026,245 | B2 | 4/2006 | Homma et al. |
| 7,435,682 | B2 | 10/2008 | Matsui et al. |
| 7,981,594 | B2 | 7/2011 | Yoon et al. |
| 8,637,219 | B2 | 1/2014 | Cho et al. |
| 2002/0023389 | A1 | 2/2002 | Minamihaba et al. |
| 2002/0086618 | A1 | 7/2002 | Ota et al. |
| 2003/0228763 | A1 | 12/2003 | Schroeder et al. |
| 2004/0214444 | A1 | 10/2004 | Kim et al. |
| 2007/0069176 | A1* | 3/2007 | Kato .............. C09G 1/02 252/79.1 |
| 2014/0209566 | A1* | 7/2014 | Fu .............. C09G 1/02 216/53 |
| 2016/0068711 | A1 | 3/2016 | Choi et al. |

FOREIGN PATENT DOCUMENTS

| | | |
|---|---|---|
| JP | 2007-154175 A | 6/2007 |
| JP | 2011-060888 A | 3/2011 |
| KR | 10-0358588 B1 | 2/2003 |
| KR | 10-0866015 B1 | 10/2008 |
| KR | 10-0908601 A | 12/2008 |
| KR | 10-1311942 A | 7/2011 |
| WO | 2014/171766 A1 | 10/2014 |

OTHER PUBLICATIONS

Office Action in counterpart Korean Application No. 10-2014-0045953 dated Feb. 24, 2016, pp. 1-6.

\* cited by examiner

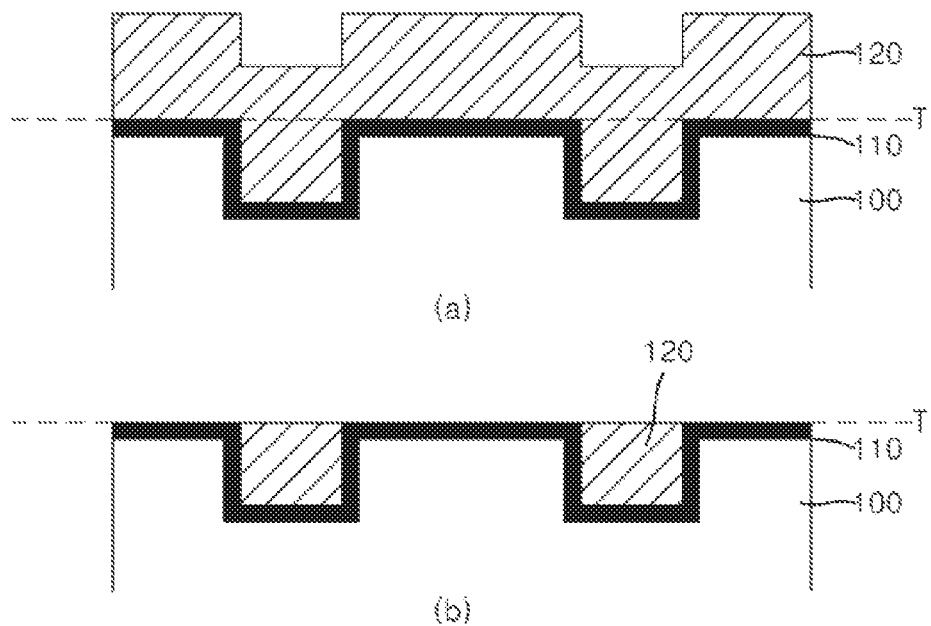

ORGANIC FILM CMP SLURRY COMPOSITION AND POLISHING METHOD USING SAME

CROSS-REFERENCE TO RELATED APPLICATIONS

This application is a divisional application of U.S. application Ser. No. 14/785,014, pending, which was filed Oct. 16, 2015, in the United States Patent and Trademark Office as a National Stage entry from International Application No. PCT/KR2014/003367, filed Apr. 17, 2014, which published as WO 2014/171766 on Oct. 23, 2014; Korean Patent Application No. 10-2013-0042551, filed in the Korean Intellectual Property Office on Apr. 17, 2013; and Korean Patent Application No. 10-2014-0045953, filed in the Korean Intellectual Property Office on Apr. 17, 2014, the entire disclosure of each of which is incorporated herein by reference.

TECHNICAL FIELD

The present invention relates to a CMP slurry composition for organic films and a polishing method using the same.

BACKGROUND ART

A method for producing a semiconductor includes a process of forming an inorganic film for example a silicon oxide film or a silicon nitride film on a patterned silicon wafer and a process of gap-filling via-holes formed in the inorganic film. The gap-filling process is performed to fill the via-holes with organic film materials, after the gap-filling process, a planarization process is performed to remove excess of the organic film. For planarization process, polishing by CMP (chemical mechanical polishing) attracts attention in the art.

A typical CMP slurry composition for organic films includes polymer polishing particles in order to allow the organic films to be polished at a high polishing amount per unit time without deterioration in surface conditions such as scratches. However, since the organic films are not made of the same material, the typical CMP slurry composition fails to achieve a desired polishing amount while enhancing a degree of planarization on a polished surface, with respect to some kind of organic film. Moreover, when a metal oxide abrasive used in polishing of metal films such as silicon and the like is used in polishing of the organic films, it is difficult achieve a desired polishing amount with respect to some kind of organic film, and/or the degree of planarization on a polished surface is lowered due to scratches and the like.

DISCLOSURE

Technical Problem

It is an aspect of the present invention to provide a CMP slurry composition for organic films, which has excellent effects in polishing the organic film having high carbon content, film density and hardness.

It is another aspect of the present invention to provide a CMP slurry composition for organic films, which shows an excellent degree of planarization on the polished surface after polishing the organic film having high carbon content, film density and hardness and allows easy removal of residues of the organic film remaining on the polishing stop film, thereby securing more uniform polishing.

Technical Solution

A CMP slurry composition for organic films according to the present invention may include at least one of polar solvents and non-polar solvents; and a metal oxide abrasive, wherein the composition is acidic, and is capable of being used for polishing organic films having a carbon content of about 50 atm % to 95 atm%.

A method of polishing an organic film according to the present invention may include polishing an organic film, which has a carbon content of about 50 atm% to 95 atm%, a film density of about 0.5 g/cm$^3$ to about 2.5 g/cm$^3$ and a hardness of about 0.4 GPa or more, using the CMP slurry composition for organic films.

Advantageous Effects

The present invention provides a CMP slurry composition for organic films, which has excellent effects in polishing the organic film having high carbon content, film density and hardness. The present invention provides a CMP slurry composition for organic films, which shows an excellent degree of planarization on the polished surface after polishing the organic film having high carbon content, film density and hardness and allows easy removal of residues of the organic film remaining on the polishing stop film, thereby securing more uniform polishing.

BRIEF DESCRIPTION OF DRAWINGS

FIG. 1 shows a schematic view of a method for polishing an organic film in accordance with one embodiment of the present invention.

BEST MODEL

Exemplary embodiments of the present invention will be described in more detail with reference to the attached drawings such that a person skilled in the art can easily realize and use the present invention. It should be understood that the present invention may be embodied in different ways and is not limited to the following embodiments. In the drawings, portions irrelevant to the description will be omitted for clarity. Like components will be denoted by like reference numerals throughout the specification.

As used herein, the term "substituted or unsubstituted" means that a hydrogen atom in a functional group is non-substituted or substituted with a hydroxyl group, a halogen atom, a thionyl group, a thiol group, a cyano group, a substituted or unsubstituted amino group, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or combinations thereof.

As used herein, the term "functional group including P" may be represented by Formula A, and the term "functional group including B" may be represented by Formula B:

*—(O)n-(CH$_2$)m-P(=O)(R)(R')  <Formula A>

*—B(R)(R')  <Formula B>

(wherein in Formula A and Formula B, n is 0 or 1, m is an integer from 0 to 10,

R, R' are each independently, hydrogen, a hydroxyl group, a substituted or unsubstituted C1 to C20 alkyl group, a substituted or unsubstituted C2 to C20 alkenyl group, a substituted or unsubstituted C3 to C20 cycloalkyl group, a substituted or unsubstituted C1 to C20 haloalkyl group, a substituted or unsubstituted C1 to C20 alkylsulfonate group, a substituted or unsubstituted C1 to C20 alkylsulfonyl group, a substituted or unsubstituted C2 to C20 alkylamide group, a substituted or unsubstituted C3 to C20 alkylester group, a substituted or unsubstituted C2 to C20 cyanoalkyl group, a substituted or unsubstituted C1 to C20 alkoxy group, a substituted or unsubstituted C6 to C30 aryl group, a substituted or unsubstituted C6 to C30 arylalkyl group, or a substituted or unsubstituted C6 to C30 aryloxy group, or R, R' are linked to each other to form a substituted or unsubstituted C3 to C20 cycloalkyl group or a substituted or unsubstituted C3 to C20 heterocycloalkyl group).

Preferably, the "functional group including P" is a functional group including P and O, for example, —P(=O)(OH)$_2$, —O—P(=O)(OH)$_2$, —P(=O)(OCH$_2$CH$_3$)$_2$, —P(=O)(C$_2$H$_4$C$_6$H$_5$)(OCH$_2$CH$_3$), and the like, for instance, the "functional group including B" is a functional group including B and O, for example, —B(OH)$_2$, —B(H)(CH$_3$), —B(CH$_2$CH$_3$)$_2$.

When an inorganic film is deposited on a patterned wafer, fur example, a patterned silicon wafer, an organic film fills via-holes formed therein. The CMP slurry composition must be capable of polishing an organic film at a sufficient polishing rate in order to planarize the deposited film and be capable of increasing the degree of planarization on the polished surface, after polishing, the residue remaining on the inorganic film must be easily removable. The inorganic film may be film formed with at least one of silicon oxide and silicon nitride, without being limited thereto.

The organic film may have significantly different polishing amounts per unit time and the degree of planarization after polishing, depending upon the materials for the organic film.

The CMP slurry composition for organic films according to the present invention is a composition for polishing an organic film having high carbon content. When the CMP slurry composition of the present invention is used for polishing the organic film, it is possible to enhance the polishing amount of the organic film per unit time and the degree of planarization of the organic film and to facilitate removal of residues from the inorganic film after polishing.

As a polishing target, the organic film according to the present invention has relatively higher values in terms of carbon content, film density and hardness, than typical organic films, and thus cannot be polished using a typical CMP slurry composition for organic films including polymer particles. On the contrary, the CMP slurry composition according to the present invention is capable of polishing the organic film at a high polishing amount of the organic film per unit time without deteriorating surface conditions due to scratches. Specifically, the polishing amount of the organic film per unit time is about 500 Å/min or more, for example, about 1,000 Å/min or more, for example, about 500 to 5000 Å/min. Within this range, a desired polishing amount can be secured.

In one embodiment, the organic film may have a carbon content from about 50 atom % to 95 atom %, for example, from about 65 atom % to 95 atom %, or, for example, from about 70 atom % to 92 atom %, such as about 65 atom %, 66 atom %, 67 atom %, 68 atom %, 69 atom %, 70 atom %, 71 atom %, 72 atom %, 73 atom %, 74 atom %, 75 atom %, 76 atom %, 77 atom %, 78 atom %, 79 atom %, 80 atom %, 81 atom %, 82 atom %, 83 atom %, 84 atom %, 85 atom %, 86 atom %, 87 atom %, 88 atom %, 89 atom %, 90 atom %, 91 atom %, 92 atom %, 93 atom %, 94 atom %, or 95 atom %. Within this range, when the organic film is polished using a metal oxide abrasive, the polishing amount is high, there is no scratching, and the degree of planarization on the polished surface is high. The organic film may have a film density from about 0.5 g/cm$^3$ to 2.5 g/cm$^3$, for example, from about 1.0 g/cm$^3$ to 2.0 g/cm$^3$, for example, from about 1.2 g/cm$^3$ to 1.6 g/cm$^3$; for example, about 0.5 g/cm$^3$, 0.6 g/cm$^3$, 0.7 g/cm$^3$, 0.8 g/cm$^3$, 0.9 g/cm$^3$, 1.0 g/cm$^3$, 1.1 g/cm$^3$, 1.2 g/cm$^3$, 1.3 g/cm$^3$, 1.4 g/cm$^3$, 1.5 g/cm$^3$, 1.6 g/cm$^3$, 1.7 g/cm$^3$, 1.8 g/cm$^3$, 1.9 g/cm$^3$, 2.0 g/cm$^3$, 2.1 g/cm$^3$, 2.2 g/cm$^3$, 2.3 g/cm$^3$, 2.4 g/cm$^3$, or 2.5 g/cm$^3$. Within this range, when the organic film is polished using a metal oxide abrasive, the polishing amount is high, there is no scratching, and the degree of planarization on the polished surface is high. The organic film may have a hardness of about 0.4 GPa or more, for example, about 1.0 GPa or more, for example, about 1.3 GPa, or more, for example, from about 1.0 GPa to 1.5 GPa, for example, about 0.4 GPa, 0.5 GPa, 0.6 GPa, 0.7 GPa, 0.8 GPa, 0.9 GPa, 1.0 GPa, 1.1 GPa, 1.2 GPa, 1.3 GPa, 1.4 GPa, or 1.5 GPa. Within this range, when the organic film is polished using a metal oxide abrasive, the polishing amount is high, there is no scratching, and the degree of planarization on the polished surface is high.

Further, the organic film according to the present invention may have an acid value of substantially about 0 mgKOH/g. In the case of polishing the organic film using the prior CMP slurry composition for organic films including a polymer abrasive, there is a problem in that the polishing rate is lowered. On the contrary, the CMP slurry composition according to the present invention has a merit that the polishing amount of the organic film per unit time applicable to the CMP process can be secured. The term "substantially" includes the cases where the acid value is not only 0 mgKOH/g but also 0 mgKOH/g with an acceptable margin of error.

Specifically, the organic film according to the present invention may be produced by applying a composition including a compound having a substituted or unsubstituted aromatic group to an inorganic film, followed by baking at high temperature, for example, at about 200° C. to 400° C.

The term "compound having a substituted or unsubstituted aromatic group" refers to a compound which is not decomposed after baking and allows an organic film formed of the composition to have high carbon content. The unsubstituted aromatic group refers to a single or fused polycyclic aromatic group having C6 to C100, for example, C6 to C50. More particularly, the unsubstituted aromatic group may include units represented by Formulae 1-1 to 1-26:

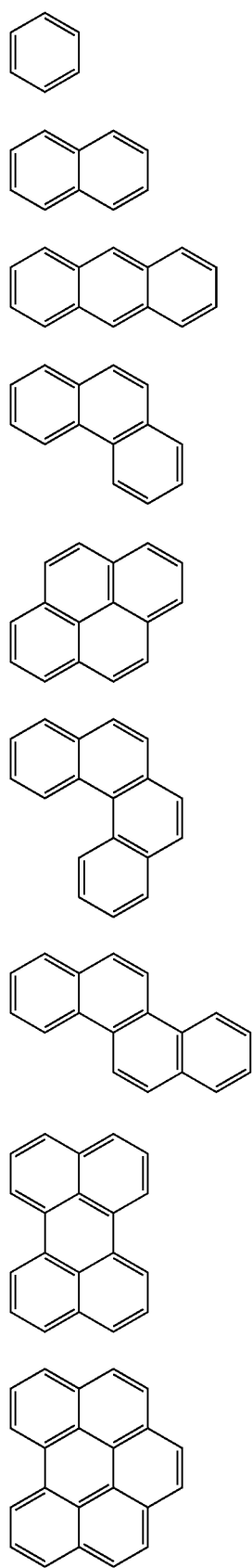
<Formula 1-1>
<Formula 1-2>
<Formula 1-3>
<Formula 1-4>
<Formula 1-5>
<Formula 1-6>
<Formula 1-7>
<Formula 1-8>
<Formula 1-9>
-continued
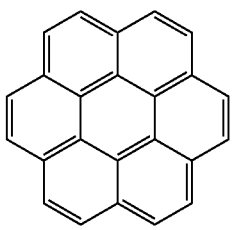
<Formula 1-10>
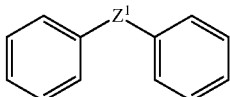
<Formula 1-11>
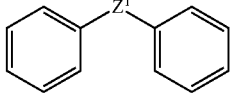
<Formula 1-12>
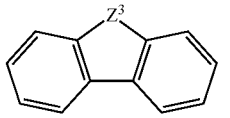
<Formula 1-13>
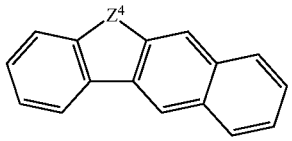
<Formula 1-14>
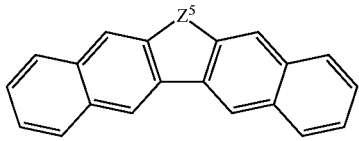
<Formula 1-15>
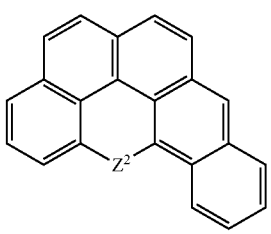
<Formula 1-16>
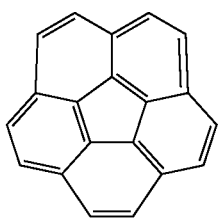
<Formula 1-17>
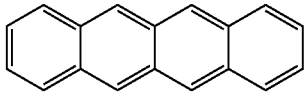
<Formula 1-18>
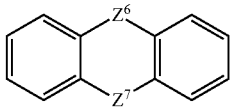
<Formula 1-19>
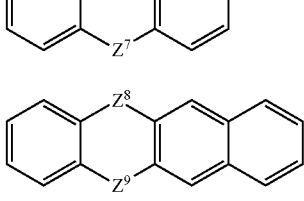

-continued

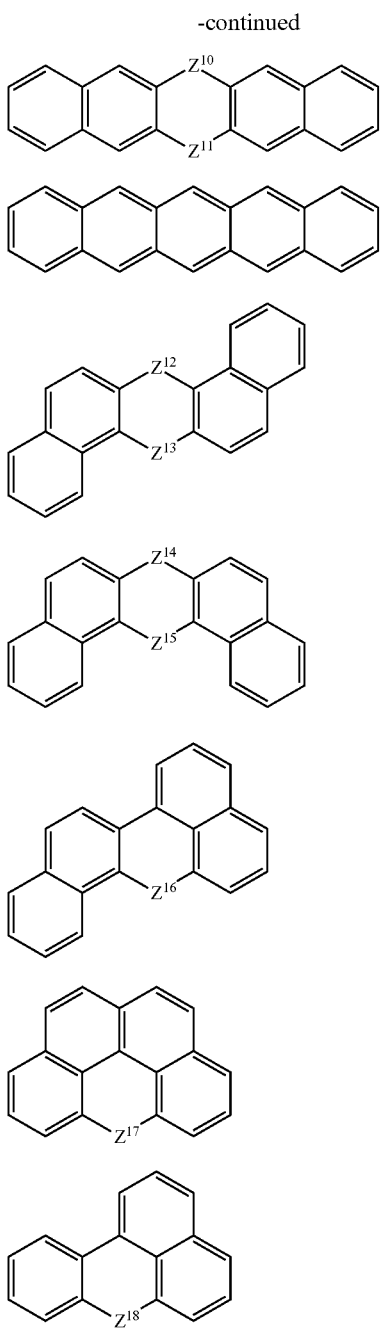

<Formula 1-20>

<Formula 1-21>

<Formula 1-22>

<Formula 1-23>

<Formula 1-24>

<Formula 1-25>

<Formula 1-26>

(wherein in :Formula 1-1 to Formula 1-26, $Z^1$ to $Z^{18}$ are each independently a single bond, a substituted or unsubstituted C1 to C20 alkylene group, a substituted or unsubstituted C2 to C20 alkenylene group, a substituted or unsubstituted C2 to C20 alkynylene group, a substituted or unsubstituted C3 to C20 cycloalkylene group, a substituted or unsubstituted C3 to C20 cycloalkenylene group, a substituted or unsubstituted C6 to C20 arylene group, a substituted or unsubstituted C2 to C20 heteroarylene group, —(C=O)—, —$NR^a$—, —$CR^bR^c$—, oxygen (O), sulfur (S), or combinations thereof, and wherein $R^a$ to $R^c$ are each independently, hydrogen, a substituted or unsubstituted C1 to C10 alkyl group, a halogen atom, a substituted or unsubstituted C6 to C20 aryl group, a substituted or unsubstituted C2 to C20 heteroaryl group or combinations thereof).

Embodiments of a composition for forming an organic film, which includes a compound having a substituted or unsubstituted aromatic group, will be described in detail hereinafter.

In a first embodiment, the composition for forming the organic film may include a material including Formula 2 as the compound having a substituted or unsubstituted aromatic group:

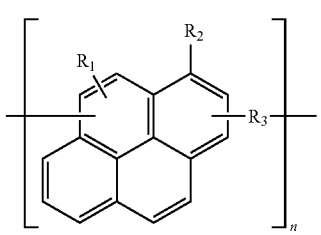

<Formula 2>

(wherein in Formula 2, n is 1≤n≤190, $R_1$ is hydrogen, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or combinations thereof, $R_2$ is hydrogen, an amino group, a substituted or unsubstituted C1 to C20 alkoxy group, a substituted or unsubstituted C6 to C20 aryloxy group, dialkylamino group(—NRR', wherein R, R' are each independently a substituted or unsubstituted C1 to C10 alkyl group or a substituted or unsubstituted C6 to C10 aryl group), a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or combinations thereof, $R_3$ is one selected from among substituted or unsubstituted

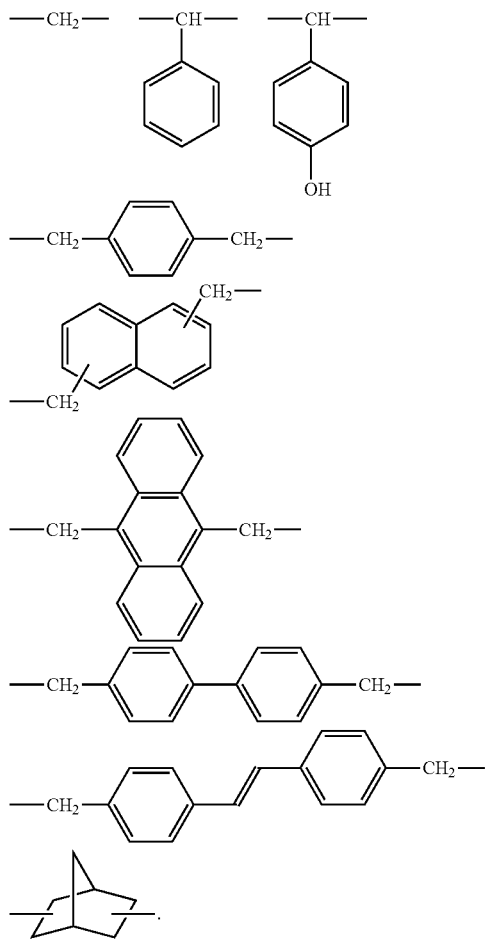

For example, $R_2$ may be a substituted or unsubstituted C1 to C10 alkoxy group.

The material comprising Formula 2 can increase carbon content, film density and hardness of the organic film formed after baking the organic film composition. A detailed process of preparing the material comprising Formula 2 can be found in Korean Patent No. 10-0866015.

The organic film composition according to the first embodiment may further include at least one of a crosslinking component, an acid catalyst and an organic solvent, in addition to the material comprising Formula 2. Specifically, the organic film composition may include about 1 wt % to 20 wt % of the material comprising Formula 2, about 0.1 wt % to 5 wt % of the crosslinking component, about 0.001 wt % to 0.05 wt % of the acid catalyst, and about 75 wt % to 98.8 wt % of the organic solvent.

The crosslinking component may include at least one of a melamine resin(specific examples may include N-methoxymethyl-melamine resin, N-butoxy methyl-melamine resin), a methylated or butylated urea resin, an amino resin, a glycoluril derivative represented by Formula 3, a bisepoxy compound represented by Formula 4, and a melamine derivative represented by Formula 5:

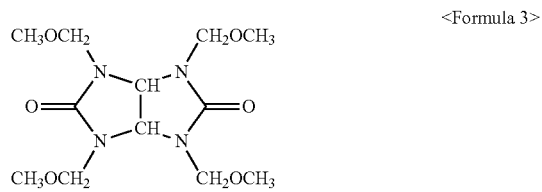

<Formula 3>

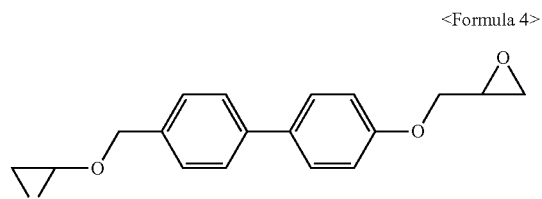

<Formula 4>

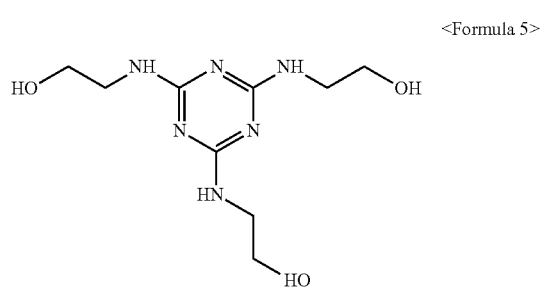

<Formula 5>

The acid catalyst may include at least one of p-toluene sulfonate monohydrate, pyridinium p-toluene sulfonate, 2,4,4,6-tetrabrotnocyclohexadienone, benzoin tosylate, 2-nitrobenzyl tosylate, and alkyl esters of organic sulfonic acid. Any organic solvent capable of sufficiently dissolving the compound having a substituted or unsubstituted aromatic group may be used as the organic solvent, for example, examples of the organic solvent may include propylenegly-colmonomethyletheracetate, cyclohexanone, ethyl lactate, and the like.

The organic film composition according to the first embodiment may be coated to a thickness of about 500 Å to 4000 Å, followed by baking at about 200° C. to 400° C. for about 10 seconds to 10 minutes to form an organic film, without being limited thereto.

In a second embodiment, the composition for forming the organic film may include a material represented by Formula 6 as the compound having a substituted or unsubstituted aromatic group:

<Formula 6>

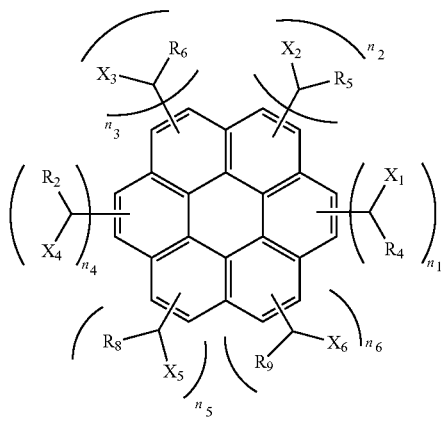

(wherein in Formula 6, $R_4$ to $R_9$, $X_1$ to $X_6$ are each independently, hydrogen, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or combinations thereof, $n_1$ to $n_6$ are each independently 0 to 2, $2 \leq n_1+n_2+n_3+n_4+n_5+n_6 \leq 6$)

For example, $R_4$ to $R_9$ are each independently a substituted or unsubstituted C1 to C10 alkyl group, a substituted or unsubstituted C6 to C20 aryl group, a substituted or unsubstituted C3 to C20 cycloalkyl group, a substituted or unsubstituted C3 to C20 cycloalkenyl group, a functional group including P, or a functional group including B.

For example, $X_1$ to $X_6$ are each independently hydrogen, a hydroxyl group, a substituted or unsubstituted C1 to C20 alkylamine group, an amino group, a functional group including P, or a functional group including B.

The organic film composition according to the second embodiment is substantially the same as the organic film composition according to the first embodiment except that the organic film composition according to the second embodiment includes a material represented by Formula 6 instead of the material comprising Formula 2, as the compound having a substituted or unsubstituted aromatic group. The following is a description of the material represented by Formula 6.

The material represented by Formula 6 may be a mixture of two or more compounds, in which positions of substituents are different from each other. Further, the material represented by Formula 6 includes an aromatic ring having strong absorption at short wavelength ranges (for example, about 193 nm, about 248 nm), and thus performs crosslinking reaction at high temperature without using a particular catalyst, which prevents contamination by the catalyst, specifically by an acid. The compound represented by Formula 6 having an aromatic group may have an average molecular weight from about 500 g/mol to 4000 g/mol. Within this range, the organic film composition can form an organic film having an appropriate thickness or an excellent thin film.

The material represented by Formula 6 may increase carbon content, film density and hardness of the organic film formed after baking the organic film composition. The material represented by Formula 6 may be produced by a typical method, for example, by reacting coronene with acetylchloride, benzoylchloride, naphthoylchloride, or cyclohexanecarbonylchloride, followed by reducing the resultant material, without being limited thereto. A more detailed process for producing the material represented by Formula 6 can be found in Korean Patent No. 10-1311942.

In a third embodiment, the composition for forming the organic film may include a polymer containing aromatic groups selected from (i) a compound represented by Formula 7, (ii) a mixture of the compound represented by Formula 7 and a compound represented by Formula 8, and (iii) a compound represented by Formula 9, as the compound having a substituted or unsubstituted aromatic group:

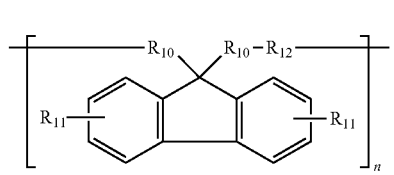

<Formula 7>

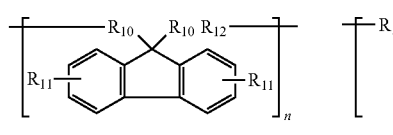

<Formula 8>

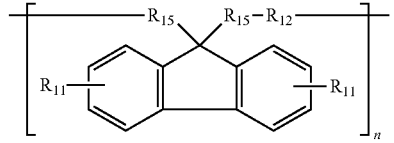

<Formula 9>

(wherein in Formula 7 to Formula 9, m and n are $1 \leq n < 750$, $1 \leq m < 750$, $2 \leq m+n < 1500$, respectively, $R_{10}$ is one selected from among substituted or unsubstituted

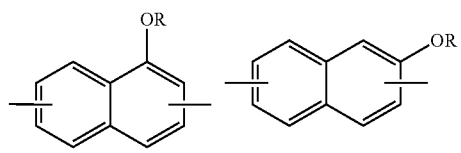

-continued

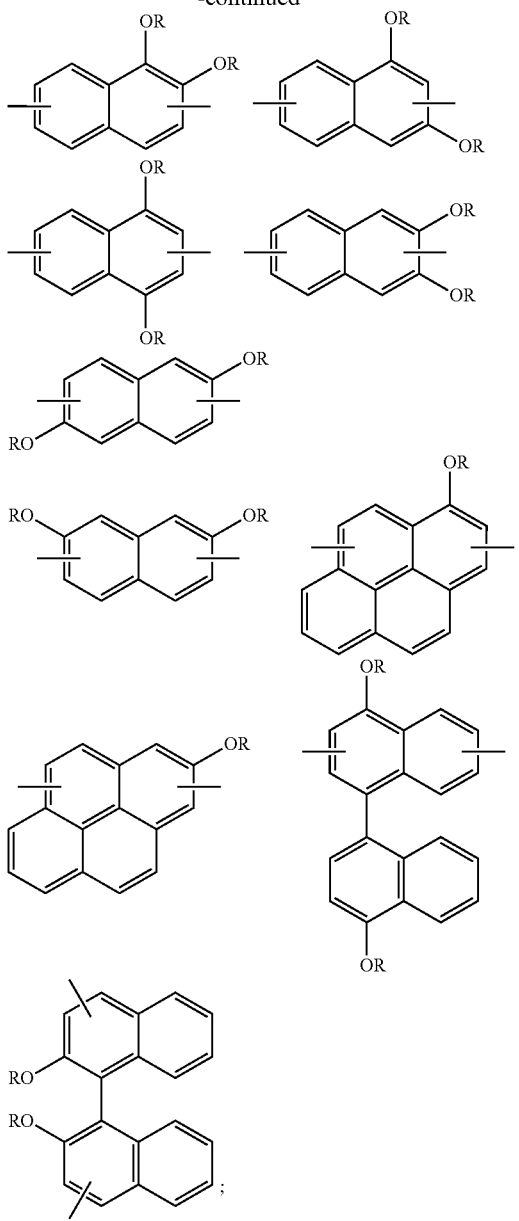

R$_{11}$ is hydrogen, a hydroxyl group, a halogen atom, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or combinations thereof, R$_{12}$ is one selected from among substituted or unsubstituted

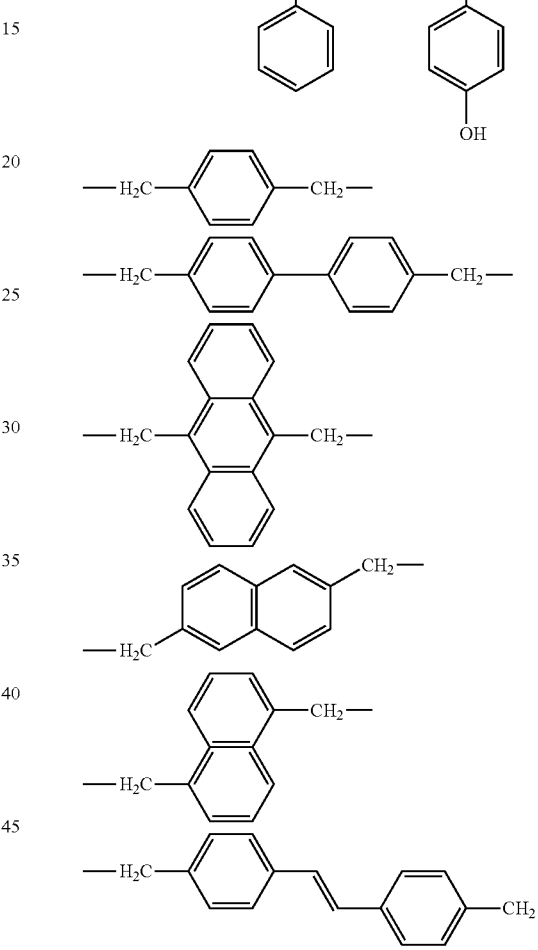

R$_{13}$ is one selected from among substituted or unsubstituted

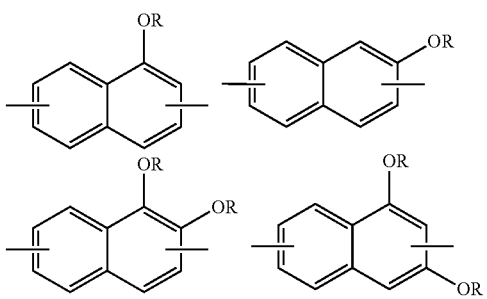

-continued
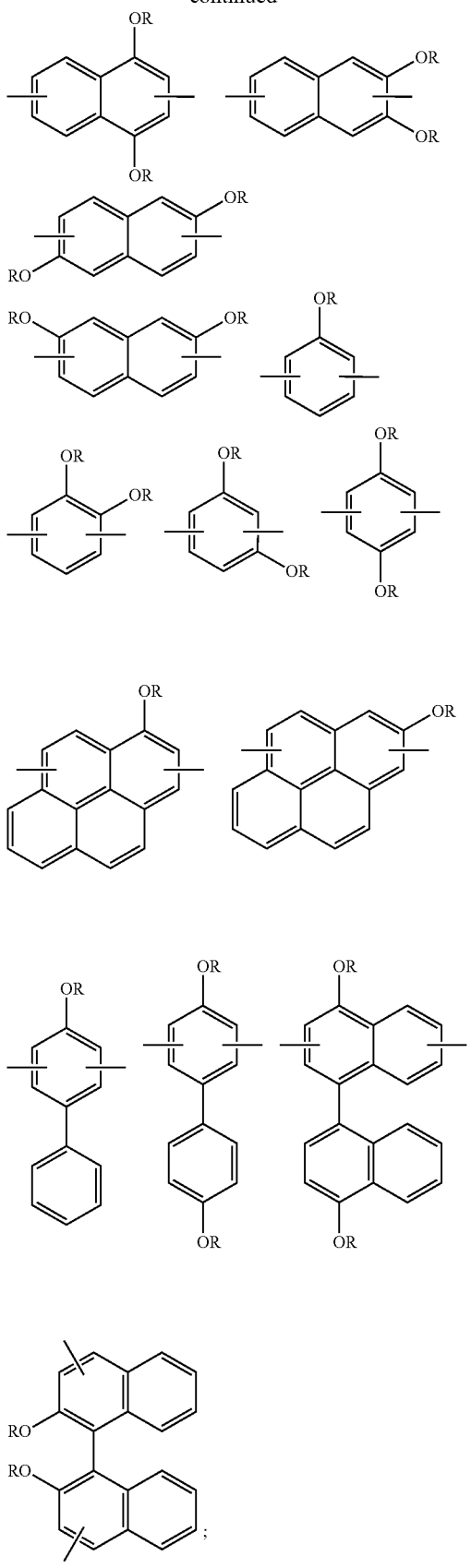
$R_{14}$ is one selected from among substituted or unsubstituted
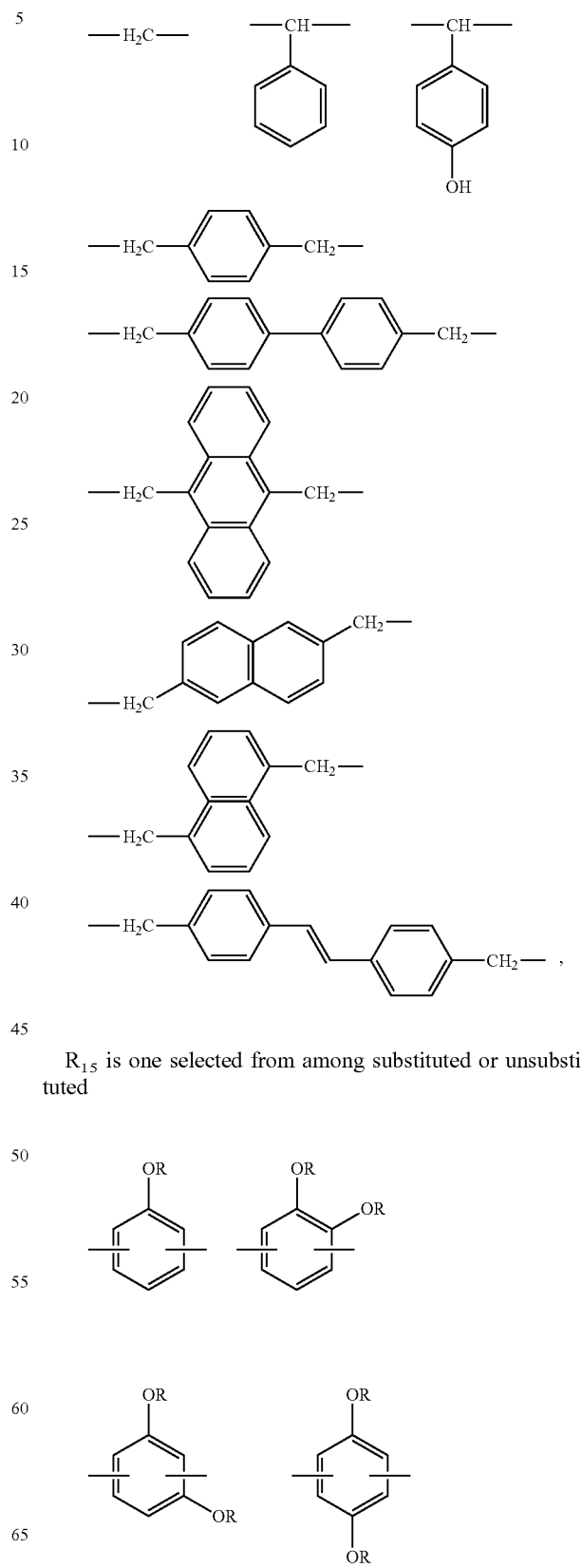
$R_{15}$ is one selected from among substituted or unsubstituted

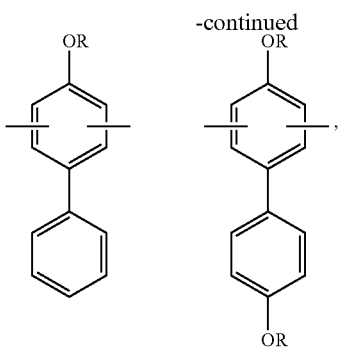

R in $R_{10}$, $R_{13}$, and $R_{15}$ is each independently hydrogen, a hydroxyl group, a halogen atom, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or combinations thereof).

The organic film composition according to the third embodiment is substantially the same as the organic film composition according to the first embodiment except that the organic film composition according to the third embodiment includes the polymer containing aromatic groups instead of the material comprising Formula 2, as the compound having a substituted or unsubstituted aromatic group. The following is a description of the polymer containing aromatic groups.

The polymer containing aromatic groups may increase carbon content, film density and hardness of the organic film formed after baking the organic film composition. The polymer containing aromatic groups may be produced by a typical method. A detailed process for producing the polymer can found in Korean Patent No. 10-0908601.

In a fourth embodiment, a composition for forming the organic film may include at least two of the material comprising Formula 2; the material represented by Formula 6; and the polymers containing aromatic groups selected from (i), (ii), and (iii), as the compounds having a substituted or unsubstituted aromatic group. The composition for forming the organic film according to the fourth embodiment is substantially the same as the composition for forming the organic film according to the first embodiment except that the organic film composition according to the fourth embodiment includes at least two the compounds having a substituted or unsubstituted aromatic group.

Next, a CMP slurry composition for organic films according to one embodiment of the present invention will be described.

The CMP slurry composition for organic films according to one embodiment of the present invention may include at least one of polar solvents and non-polar solvents; and a metal oxide abrasive, and may be acidic. As a result, the composition can polish the organic film of the present invention at a high polishing amount without scratching and can increase the degree of planarization on a polished surface.

The polar and/or non-polar solvents may serve to reduce friction when the organic film having high carbon content is polished with the metal oxide abrasive. Examples of the polar and/or non-polar solvents may include water, for example, ultrapurified water, organic amines, organic alcohols, organic alcohol amines, organic ethers, organic ketones, and the like. For example, ultrapurified water may be used as the polar and/or non-polar solvents. The polar and/or non-polar solvents may be present in the balance amount in the CMP slurry composition.

The metal oxide abrasive may serve to polish the organic film having high carbon content, high film density and high hardness at a high polishing amount. Specifically, the metal oxide abrasive may enhance the degree of planarization on the polished surface without scratching when the organic film according to the present invention is polished with the metal oxide abrasive. More specifically, the metal oxide abrasive may include at least one of silica, alumina, ceria, titania, and zirconia.. Particularly, silica may have better dispersion stability. Ceria may provide a high polishing rate even in the case where an oxidant is absent or present in an extremely small amount in the slurry composition.

The metal oxide abrasive is composed of spherical particles and has an average particle size from about 10 nm to about 150 nm, for example, from about 30 nm to 70 nm, for example, about 30 nm, 35 nm, 40 nm, 45 nm, 50 nm, 55 nm, 60 nm, 65 nm, or 70 nm. Within this range, the metal oxide abrasive can secure a sufficient polishing rate with respect the organic film of the present invention without scratching and enhance the degree of planarization.

The metal oxide abrasive is present in an amount of about 0.1 wt % to 20 wt %, for example about 0.1 wt % to 15 wt %, for example, about 0.1 wt % to 5 wt %, for example, about 0.1 wt %, 0.2 wt %, 0.3 wt %, 0.4 wt %, 0.5 wt %, 0.6 wt %, 0.7 wt %, 0.8 wt %, 0.9 wt %, 1 wt%, 1.1 wt %, 1.2 wt %, 1.3 wt %, 1.4 wt %, 1.5 wt %, 1.6 wt %, 1.7 wt %, 1.8 wt %, 1.9 wt %, 2 wt %, 2.1 wt %, 2.2 wt %, 2.3 wt %, 2.4 wt %, 2.5 wt %, 2.6 wt %, 2.7 wt %, 2.8 wt %, 2.9 wt %, 3 wt %, 3.1 wt %, 3.2 wt %, 3.3 wt %, 3.4 wt %, 3.5 wt %, 3.6 wt %, 3.7 wt %, 3.8 wt %, 3.9 wt %, 4 wt %, 4.1 wt %, 4.2 wt %, 4.3 wt %, 4.4 wt %, 4.5 wt %, 4.6 wt %, 4.7 wt %, 4.8 wt %, 4.9 wt %, or 5 wt %, in the CMP slurry composition. Within this content range of the metal oxide abrasive, the slurry composition can secure a sufficient polishing rate with respect the organic film of the present invention without scratching and enhance the dispersion stability. Preferably, the slurry composition secures an enhanced polishing rate with respect to the organic film and a low polishing rate with respect to an inorganic film by increasing the average particle size of the metal oxide abrasive while reducing the content of the metal oxide abrasive in the slurry composition.

The CMP slurry composition may be acidic and thus has high polishing selectivity ratio of the organic film over the inorganic film, and can enhance the polishing amount per unit time with respect to the organic film and the degree of planarization. Specifically, the CMP slurry composition may have a pH value of about 6 or less, for example, about 5 or less, for example, 1 to 5, for example, about 1.0, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4, 4.1, 4.2, 4.3, 4.4, 4.5, 4.6, 4.7, 4.8, 4.9, or 5. The pH of the CMP slurry composition according to one embodiment of the present invention may be adjusted in this range of pH using, for example, a pH adjusting agent. Examples of the pH adjusting agent may include an inorganic acid, for example, at least one of nitric acid, phosphoric acid, hydrochloric acid, and sulfuric acid, and an organic acid, for example, an organic acid having a pKa value of 6 or less, for example, at least one of acetic acid and citric acid, without being limited thereto.

The CMP slurry composition may further include an additive. For example, the CMP slurry composition may further include a polishing accelerator as an additive. The polishing accelerator suppresses the polishing rate of the inorganic film, thereby increasing polishing selectivity ratio of the organic film over the inorganic film. The polishing accelerator may include at least one of organic acids such as malic acid, citric acid, formic acid, glutaric acid, oxalic acid, phthalic acid, succinic acid, tartaric acid, maleic acid, and malonic acid. The polishing accelerator may be present in an amount of about 0.02 wt % to 0.5 wt % in the CMP slurry composition. Within this range, the composition has no detrimental effect on the polishing rate, dispersion stability of the slurries, and surface properties of organic carbon films.

The CMP slurry composition may further include a pH adjusting agent in order to make the pH of the composition acidic. The pH adjusting agent may be present in an amount such that the pH of the slurry composition can be suitably adjusted, thereby increasing polishing selectivity of the organic film over the inorganic film.

Hereinafter, a CMP slurry composition for organic films according to another embodiment of the present invention will be described.

The CMP slurry composition for organic films according to another embodiment may include a polar and/or non-polar solvent, a metal oxide abrasive, and an oxidant, and thus may be acidic. As compared with the CMP slurry composition for organic films according to the one embodiment, the CMP slurry composition according to the another embodiment may further include an oxidant, thereby increasing polishing selectivity ratio of the organic film over the inorganic film, the polishing rate of the organic film, and the degree of planarization on the polished surface. The CMP slurry composition according to this embodiment is substantially the same as the CMP slurry composition according to the one embodiment except that the CMP slurry composition according to this embodiment further includes the oxidant. The following is a description for the oxidant.

In order to facilitate polishing of the organic carbon film having high carbon content, high film density and high hardness, the oxidant oxidizes a surface layer of the organic film to facilitate polishing of the organic film. When the inorganic film is exposed by polishing, the oxidant can make the surface of the organic film smooth, thereby improving roughness of the organic film even after polishing. Further, the oxidant facilitates removal of residues of the organic film remaining on the inorganic film, thereby securing uniform polishing.

Specifically, the oxidant may include at least one of metal salts in a multivalent oxidation state and transition metal chelates. As used herein, the term "multivalent" refers to divalent or higher, for example, trivalent or higher, for example, tetravalent or higher.

The metal salts in a multivalent oxidation state are capable of increasing the polishing rate of the organic film while reducing the polishing rate of the inorganic film. The metal salts may include metals such as transition metals, lanthanides, and the like, and may further include halogen, ammonium, nitrate, and the like. Specifically, the metal salts may include ceric ammonium salts, ferric halogen salts, ferric nitrate salts, and the like. For example, the metal salts may include ceric ammonium nitrate, ferric nitrate, ferric chloride, and the like.

The transition metal chelates can increase the polishing rate of the organic film while reducing the polishing rate of the inorganic film.

In the transition metal chelates, the transition metals include typical transition metals belonging to Group III to Group XII of the periodic table, for example, iron, copper, manganese, or chromium. Examples of chelates may include oxalic acid, a carboxylic acid substituted with an amino group (for example, aminopolycarboxylate such as iminodiacetic acid, ethylenediaminedisuccinic acid, iminodisuccinic acid, ethylenediaminetetraacetic acid, nitrilotriacetic acid; alpha-amino acid such as glycine, beta-amino acid), a carboxylic acid substituted with a hydroxyl group (for example, polycarboxylic acids containing a hydroxyl group such as glycolic acid, lactic acid, malic acid, citric acid, and tartaric acid), phosphonocarboxylic acid, aminophosphonic acid, and combinations thereof. Examples of the transition metal chelates may include at least one of Fe-containing compounds such as propylene diamine tetraacetic acid-Fe and the like, and Mn-containing compounds such as propylene diamine tetraacetic acid-Mn and the like, without being limited thereto.

The oxidant may be present in an amount of about 0.001 wt % to 15 wt % in the CMP slurry composition, for example, about 0.01 wt % to 5 wt %, for example, about 0.05 wt % to 3 wt %, for example, about 0.05 wt %, 0.1 wt %, 0.15 wt %, 0.2 wt %, 0.25 wt %, 0.3 wt %, 0.35 wt %, 0.4 wt %, 0.45 wt %, 0.5 wt %, 0.55 wt %, 0.6 wt %, 0.65 wt %, 0.7 wt %, 0.8 wt %, 0.85 wt %, 0.9 wt %, 0.95 wt %, 1 wt %, 1.5 wt %, 2 wt %, 2.5 wt %, or 3 wt %. Within this range of the oxidant, the CMP slurry composition can maintain suitable etching ability with respect to the organic film. The CMP slurry composition may be acidic and improve stability of the oxidant, thereby enhancing the polishing rate of the organic film, the degree of planarization on the polished surface, and polishing selectivity ratio of the organic film over the inorganic film.

Next, a method of polishing an organic film according to the present invention will be described.

The method for polishing an organic film according to the present invention may include polishing an organic film having high carbon content, high film density and high hardness using the CMP slurry composition for organic films according to the present invention, The CMP slurry composition may include CMP slurry compositions for organic films according to the emdodiments of the present invention. Referring to FIG. 1, (a) shows a stack structure of a silicon wafer, an inorganic film, and an organic carbon film before polishing. A silicon wafer 100 is subjected to patterning to have an engraved portion thereon, followed by deposition of an inorganic film 110 on the silicon wafer 100. Then, an organic carbon film 120 is deposited on the inorganic film, followed by baking at about 200° C. to about 400° C. to form the stack structure. In FIG. 1(a), T indicates a virtual polishing stop line. A CMP slurry composition is applied to the organic film shown in FIG. 1(a), followed by placing a polishing pad thereon and rotating the silicon wafer 100 to polish the stack structure. Polishing is performed until the wafer reaches the polishing stop line T, as shown in FIG. 1(b).

Next, the present invention will be described in more detail with reference to the following examples. These examples are provided for illustration only and are not to be construed in any way as limiting the present invention.

Mode for Invention

PREPARATIVE EXAMPLE 1

A 2000 ml three-necked flask provided with a thermometer, a condenser, a mechanical stirrer and a dropping funnel was dipped in an oil bath at 140° C. Heating and stirring by a magnet were performed on a hot plate, and cooling water was set to 40° C. 220 g (1 mol) of 1-methoxy pyrene was placed in the flask, followed by adding 138 g (1.0 mol) of 1,4-bismethoxymethylbenzene, which in turn was dissolved in 656 g of propyleneglycol monomethyletheracetate. Thereafter, 4.6 g (0.03 mol) of diethyl sulfate was added to the solution. The temperature of the flask was maintained at 130° C. A reaction completion point was determined by measuring the molecular weight of the reactant at certain time intervals during polymerization. Samples for measuring the molecular weight were prepared by cooling 1 g of the reactant to room temperature, obtaining 0.02 g of the mixture therefrom, followed by diluting the reactant with tetrahydrofuran such that the solid content was 4 wt %. In order to finish reaction at a predetermined reaction completion point, 4.48 g (0.03 mol) of triethanolamine was added as a neutralizing agent to the flask, followed by stirring. Subsequently, the reactant was slowly cooled to room temperature. The reactant was diluted with 500 g of propyleneglycolmonomethyletheracetate. Next, a solvent was added to a 2000 ml separation funnel. 4 kg of a mixture of methanol and ethylene glycol in a ratio of 90:10 g/g was prepared. The synthesized polymer solution was dropped into the alcohol mixture under severe stirring. The resultant polymer was harvested from the bottom of the flask and the supernatant was separately stored. After removing the supernatant, methanol was removed from the final reactant in a rotary evaporator at 60° C. for 10 minutes under reduced pressure.

As a result of GPC under tetrahydrofuran to measure the weight average molecular weight and dispersiblity of the obtained copolymer, the obtained copolymer included the unit of Formula 10 and had a weight average molecular weight of 4000 and dispersibility of 2.3.

<Formula 10>

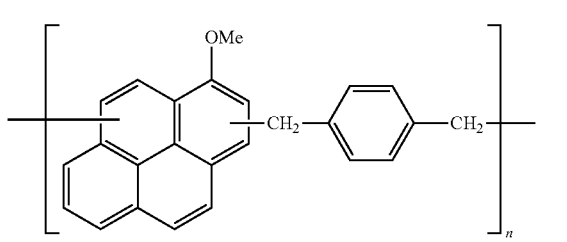

(n=11 and Me is a methyl group)

0.8 g of the prepared copolymer, 0.2 g of the crosslinking agent represent by Formula 3 (Powderlink 1174, Cytec Industries Inc.) and 2 mg of pyridinium p-toluene sulfonate were dissolved in 9 g of propyleneglycolmonomethyletheracetate, followed by filtering the reactant to prepare a composition for forming an organic films.

PREPARATIVE EXAMPLE 2

A solution prepared by dissolving 30.1 g (0.1 mol) of coronene, 47.1 g (0.6 mol) of acetyl chloride, 79.8 g (0.6 mol) of trichloroaluminium in 1000 g of toluene was added to a 2 L four-necked flask provided with a mechanical stirrer and a condenser, followed by stirring the solution with the stirrer and reacting for 10 hours. After completion of the reaction, trichloroaluminium was removed from the reactant using water. 37.83 g (1.0 mol) of sodium borohydride was added to the obtained compound and then reaction was carried out for 17 hours. Upon completion of the reaction, by-products were removed using a water/methanol mixture to obtain a compound represented by :Formula 11 (average molecular weight: 530 g/mol, $1 \le n1+n2+n3+n4+n5+n6 \le 6$).

<Formula 11>

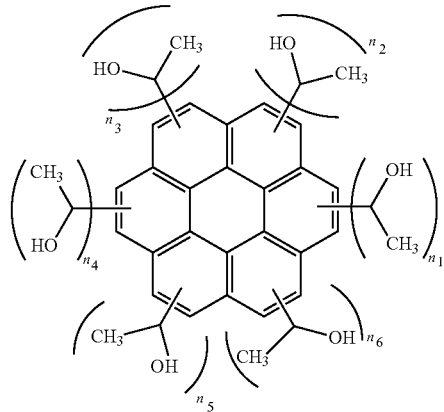

0.8 g of the compound represented by Formula 11 was dissolved in 9 g of propyleneglycolmonomethyletheracetate, followed by filtering the solution to produce a composition for organic films.

EXAMPLES 1 TO 9

A silica film as a polishing stop film was deposited to a thickness of 5000 Å on a patterned wafer having an engraved pattern formed on the surface thereof. In order to fill the engraved pattern formed on the surface of the silica film, an organic film was formed to a thickness of 2650 Å. The organic film was produced by applying the composition prepared in Preparative Example 1 to the silica film, following baking at 400° C.

The composition prepared in Preparative Example 1 was applied and baked at 400° C. for 120 seconds to obtain a specimen having a thickness of 4700 Å to 4800 Å. Hardness of the specimen was measured using a Nanoindentor (Hysitron TI750 UN). Hardness was measured by loading a tip of Nanoindentor on the specimen for 5 seconds, holding the tip for 2 seconds and unloading the tip for 5 seconds. The hardness was 0.9 GPa. The carbon content of the same specimen was measured using an element analyzer (EA 1112, Thermo). Specifically, the carbon content was measured by burning a sample in a correct amount in the presence of $O_2$, and the carbon content was 72 atm %. The film density of the same specimen was measured using an XRR (X-RAY REFLECTIVITY) tester (X'Pert PRO, PANalytical). Specifically, the refraction pattern obtained by irradiating X ray was compared with a known refraction pattern. The film density was 1.4 $g/cm^3$. The acid value of the same specimen was measured and found to be 0 mg KOH/g.

CMP slurry compositions including ultrapurified water and components as listed in Table 1 were prepared and used for polishing under following polishing conditions.

EXAMPLES 10 TO 18

A silica film as a polishing stop film was deposited to a thickness of 5000 Å on a patterned wafer having an engraved pattern on the surface thereof. In order to fill the engraved pattern formed on the silica film surface, an organic film was formed to a thickness of 2650 Å. The organic film was produced by applying the composition prepared in Preparative Example 2 to the silica film, following baking at 400° C.

The composition prepared in Preparative Example 2 was applied and baked at 400° C. for 120 seconds to obtain a specimen having a thickness of 4700 Å to 4800 Å. Hardness, carbon content, film density and acid value of the specimen were measured in the same manner as in Example 1. The hardness was 1.5 GPa, the carbon content was 80 atm %, the film density was 1.7 $g/cm^3$, and the acid value was 0 mg KOH/g.

CMP slurry compositions including ultrapurified water and components as listed in Table 2. were prepared and used for polishing under following polishing condition.

COMPARATIVE EXAMPLES 1 TO 3

CMP slurry compositions were prepared and used for polishing under following polishing condition in the same manner as in Example 1, except that the CMP slurry compositions having the components as listed in Table 1 were used.

COMPARATIVE EXAMPLES 4 TO 6

CMP slurry compositions were prepared and used for polishing under following polishing condition in the same manner as in Example 2, except that the CMP slurry compositions having the components as listed in Table 2 were used.

(1) Details of Respective Components of CMP Slurry Composition (A) Metal oxide abrasive: (a1) Ceria having an average particle size of 60 nm (SOLVAY Inc.), (a2) Colloidal silica having an average particle size of 35 nm (Evonic Inc.)

(B) Oxidant: (b1) Ceric ammonium nitrate (Samjeon Sunyak Inc.), (b2) Ferric nitrate (JUNSEI Inc.), (b3) Hydrogen peroxide (Dongwoo Finechem Inc.), (b4) Ammonium persulfate (Daejung Whakum Inc.)

(C) pH adjusting agent: Potassium hydroxide (Samjeon Sunyak Inc.), (D) Polishing accelerator: Formic acid (Daejung Whakum Inc.)

(2) Polishing Condition, Polishing Amount and Degree of Planarization

As a polishing pad, an H0800 CMP pad manufactured by FUJIBO Inc. was used. Polishing was performed for 1 minute using a 200 mm MIRRA device manufactured by. Applied Materials, AMAT Inc., under the condition of a compressing pressure of 1.0 psi, a slurry flow rate of 200 mL/minute, a table and spindle rate of 90 rpm. Polishing amounts were measured and shown in Tables 1 and 2. The degree of planarization on the polished surface was determined by checking whether the CMP slurry composition uniformly polished the organic film, as compared with the inorganic film. After polishing as mentioned above, the thickness of the polished surface was measured using a thin film thickness measuring device (ST4000, K-MAC) (unit: Å), and standard deviation was calculated from the result.

TABLE 1

(Unit: wt %)

| Component | | Example | | | | | | | | | Comparative Example | | |
|---|---|---|---|---|---|---|---|---|---|---|---|---|---|
| | | 1 | 2 | 3 | 4 | 5 | 6 | 7 | 8 | 9 | 1 | 2 | 3 |
| (A) Abrasive | (a1) | 0.5 | 0.5 | 0.5 | 0.5 | 0.5 | 0.5 | 0.5 | 0.5 | 0.5 | 0.5 | 0.5 | 0.5 |
| (B) Oxidant | (b1) | — | 0.4 | 0.4 | 2.5 | 0.05 | 2.5 | — | — | — | — | — | 0.4 |
| | (b2) | — | — | — | — | — | — | 0.4 | 2.5 | 0.05 | — | — | — |
| | (b3) | — | — | — | — | — | — | — | — | — | 3 | — | — |
| | (b4) | — | — | — | — | — | — | — | — | — | — | 0.5 | — |
| (C) pH adjusting agent | | — | — | — | — | — | — | — | — | — | — | — | 0.3 |
| pH value of slurry | | 4.5 | 1.8 | 1.9 | 1.3 | 1.9 | 1.4 | 2.1 | 1.4 | 2.6 | 8.2 | 10.3 | 7 |
| Polishing amount of organic film (Å/min) | | 1000 | 1600 | 2000 | 1400 | 1500 | 1100 | 1900 | 1300 | 1400 | 42 | 100 | 30 |
| Degree of planarization on polished surface | | 23 | 12 | 11 | 10 | 15 | 12 | 16 | 12 | 14 | 90 | 140 | 80 |

TABLE 2

(Unit: wt %)

| Component | | Example 10 | 11 | 12 | 13 | 14 | 15 | 16 | 17 | 18 | Comparative Example 4 | 5 | 6 |
|---|---|---|---|---|---|---|---|---|---|---|---|---|---|
| (A) Abrasive | (a2) | 1 | 1 | 1 | 1 | 1 | 1 | 1 | 1 | 1 | 1 | 1 | 1 |
| (B) Oxidant | (b1) | 0.4 | 0.4 | 2.5 | 0.05 | 2.5 | — | — | — | 0.4 | — | — | 0.4 |
| | (b2) | — | — | — | — | — | 0.4 | 2.5 | 0.05 | — | — | — | — |
| | (b3) | — | — | — | — | — | — | — | — | — | 3 | — | — |
| | (b4) | — | — | — | — | — | — | — | — | — | — | 0.5 | — |
| (C) pH adjusting agent | | — | — | — | — | — | — | — | — | — | — | — | 0.3 |
| (D) Polishing accelerator | | — | — | — | — | — | — | — | — | 0.4 | — | — | — |
| pH value of slurry | | 1.7 | 1.7 | 1.2 | 2.0 | 1.2 | 2.2 | 1.3 | 2.5 | 1.8 | 8 | 10 | 8 |
| Polishing amount of organic film (Å/min) | | 1500 | 1900 | 1300 | 1200 | 1000 | 1800 | 1100 | 1200 | 2500 | 10 | 10 | 5 |
| Degree of planarization on polished surface | | 10 | 7 | 6 | 2 | 8 | 5 | 3 | 2 | 1 | 70 | 90 | 60 |

*Degree of planarization on polished surface (uniformity): A lower degree of planarization indicates better planarization.

As shown in Tables 1 and 2, it could be seen that the CMP slurry composition for organic films of the present invention had a high polishing rate and a high degree of planarization on the polished surface of the organic film having high carbon content, film density and hardness. Further, it could also be seen that, as compared with Example 1, Examples 2 to 18 had an enhanced polishing rate and an enhanced degree of planarization on the polished surface of the organic film having high carbon content, film density and hardness by further including a specific oxidant.

Accordingly, the present invention provides a CMP slurry composition for organic films having excellent effects in polishing the organic film having high carbon content, film density and hardness. Further, the present invention provides a CMP slurry composition for organic films, which shows an excellent degree of planarization on the polished surface after polishing the organic film having high carbon content, film density and hardness and allows easy removal of residues of the organic film remaining on the polishing stop film, thereby securing more uniform polishing.

Conversely, the compositions of Comparative Examples in which the metal oxide abrasive was included and was not acidic showed a significantly low polishing rate with respect to the organic film having high carbon content, film density and hardness, and a much lower degree of planarization on the polished surface than the composition of Examples.

It should be understood that various modifications, changes, alterations, and equivalent embodiments can be made by those skilled in the art without departing from the spirit and scope of the present invention.

The invention claimed is:
1. A method for polishing an organic film, comprising:
polishing an organic film having a carbon content of about 50 atom% to 95 atom% and formed of a composition for preparing organic films comprising:
a composition comprising a compound having a substituted aromatic group substituted with a functional group represented by Formula A and/or a functional group represented by Formula B:

*—(O)n-(CH$_2$)m-P(=O)(R)(R')          <Formula A>

*—B(R)(R')          <Formula B> wherein in Formula A and Formula B, n is 0 or 1, m is an integer from 0 to 10, R, R' are each independently, hydrogen, a hydroxyl group, a substituted or unsubstituted C1 to C20 alkyl group, a substituted or unsubstituted C2 to C20 alkenyl group, a substituted or unsubstituted C3 to C20 cycloalkyl group, a substituted or unsubstituted C1 to C20 haloalkyl group, a substituted or unsubstituted C1 to C20 alkylsulfonate group, a substituted or unsubstituted C1 to C20 alkylsulfonyl group, a substituted or unsubstituted C2 to C20 alkylamide group, a substituted or unsubstituted C3 to C20 alkylester group, a substituted or unsubstituted C2 to C20 cyanoalkyl group, a substituted or unsubstituted C1 to C20 alkoxy group, a substituted or unsubstituted C6 to C30 aryl group, a substituted or unsubstituted C6 to C30 arylalkyl group, or a substituted or unsubstituted C6 to C30 aryloxy group, or R and R' are linked to each other to form a substituted or unsubstituted C3 to C20 cycloalkyl group or a substituted or unsubstituted C3 to C20 heterocycloalkyl group.
a composition including a material represented by Formula 2:

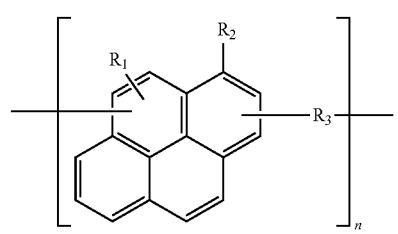

<Formula 2> wherein in Formula 2, n is 1<n<190; R$_1$ is hydrogen, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or a combination thereof; R2 is hydrogen, an amino group, a substituted or unsubstituted C1 to C20 alkoxy group, a substituted or unsubstituted C6 to C20 aryloxy group, a dialkylamino group -NRR' wherein R and R' are each independently a substituted or unsubstituted C1 to C10 alkyl group or a substituted or unsubstituted C6 to C10 aryl group, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or a combination thereof; and $R_3$ is selected from substituted or unsubstituted

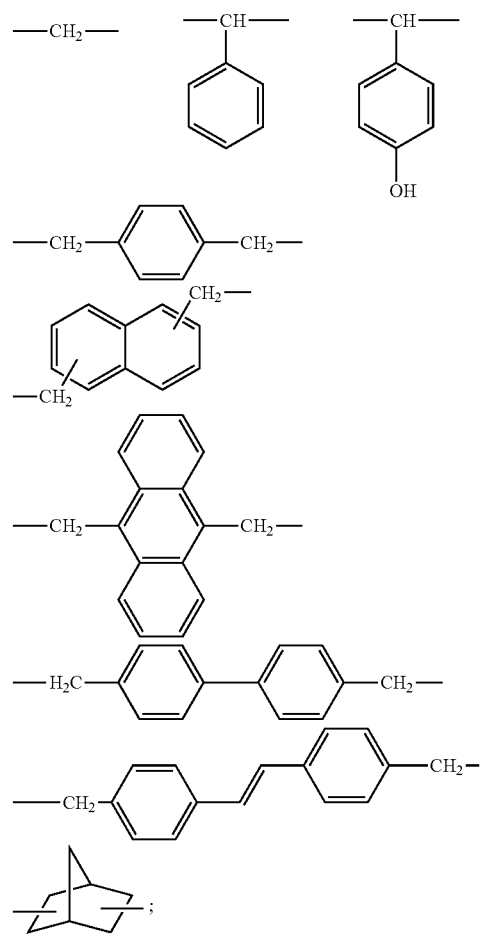

a composition including a material represented by Formula 6:

<Formula 6>

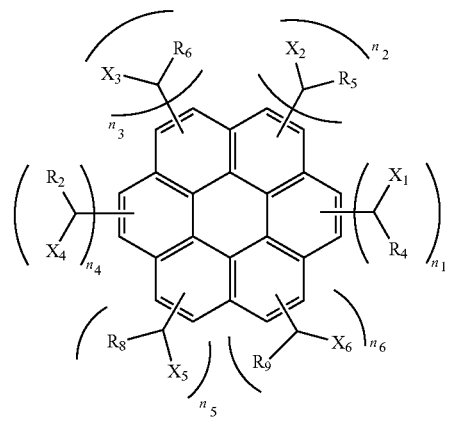

wherein in Formula 6, R4 to R9 and X1 to X6 are each independently hydrogen, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or a combination thereof; $n_1$ to $n_6$ are each independently 0 to 2; and $2 < n_1 + n_2 + n_3 + n_4 + n_5 + n_6 < 6$; and/or a composition including a polymer including aromatic groups selected from (i) a compound represented by Formula 7, (ii) a mixture of the compound represented by Formula 7 and a compound represented by Formula 8, and/or (iii) a compound represented by Formula 9:

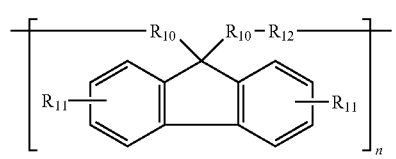
<Formula 7>

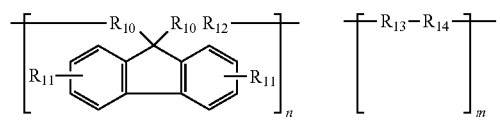
<Formula 8>

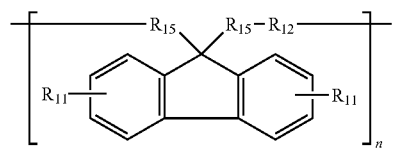
<Formula 9> wherein in Formula 7 to Formula 9, m and n are $1 < n < 750$, $1 < m < 750$, $2 < m+n < 1500$, respectively; $R_{10}$ is selected from substituted or unsubstituted

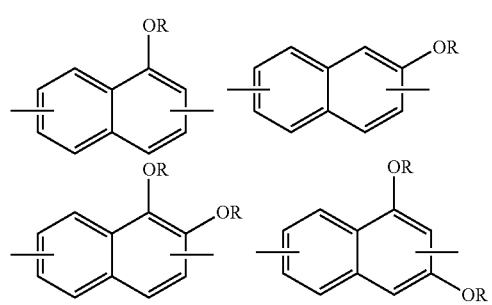

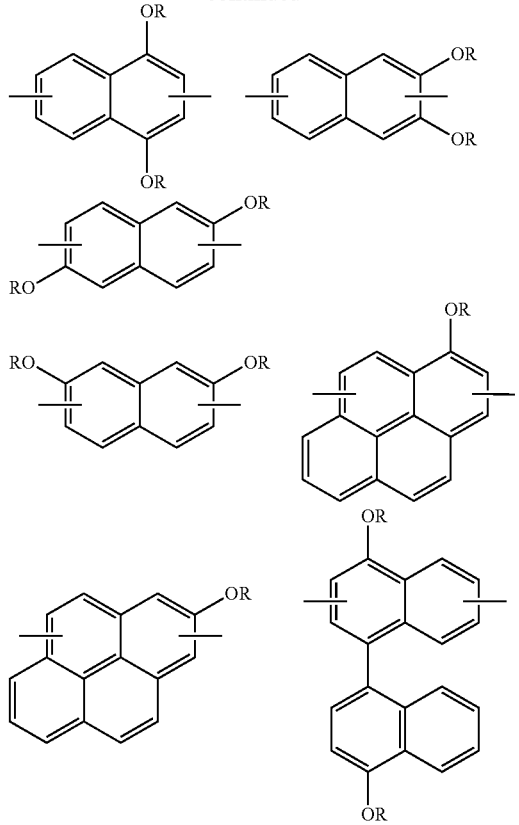

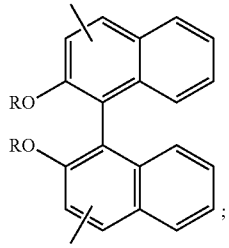

$R_{11}$ is hydrogen, a hydroxyl group, a halogen atom, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkylene ether group, a substituted or unsubstituted C1 to C30 haloalkyl group, a functional group including P, a functional group including B, or a combination thereof; $R_{12}$ is selected from substituted or unsubstituted
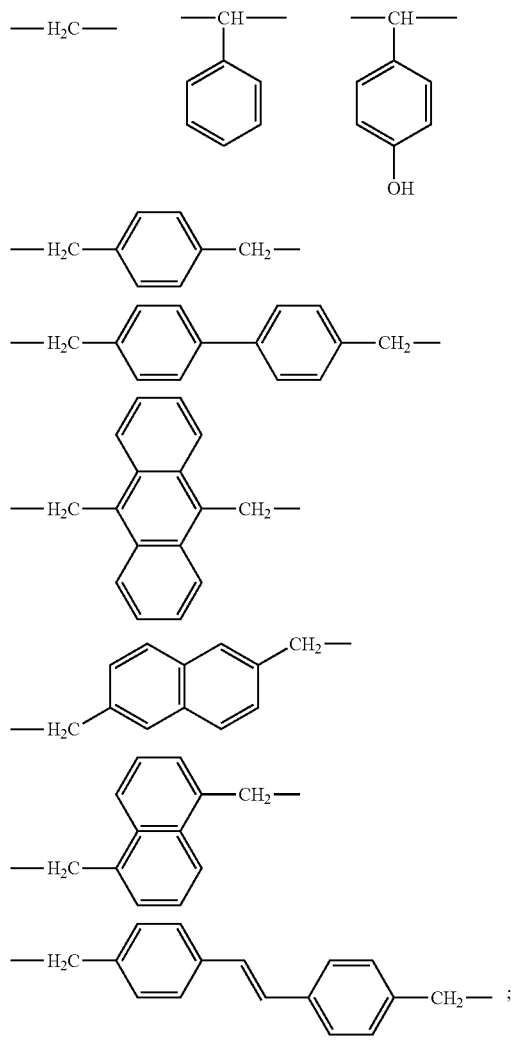
$R_{13}$ is selected from substituted or unsubstituted
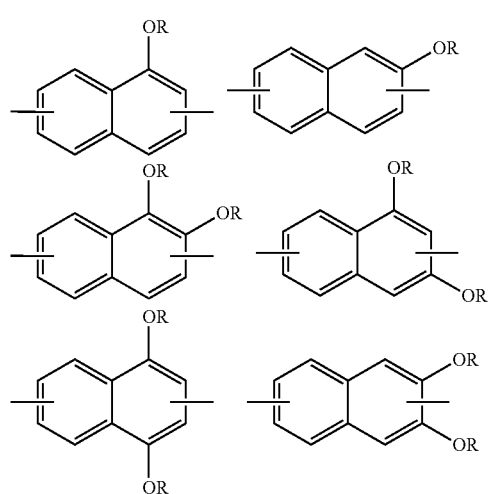
-continued
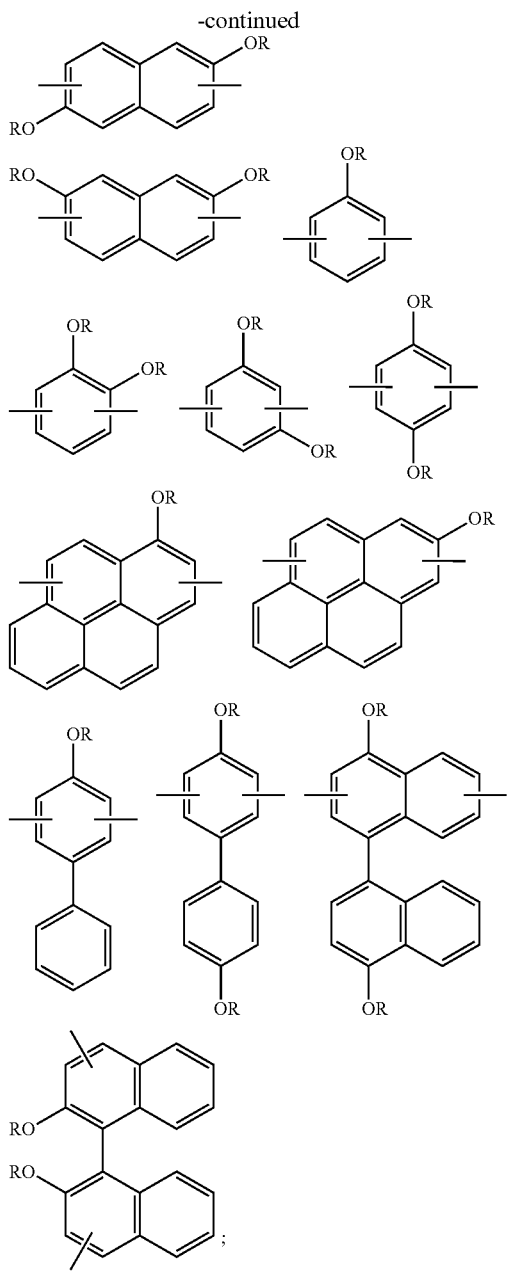
$R_{14}$ is selected from substituted or unsubstituted
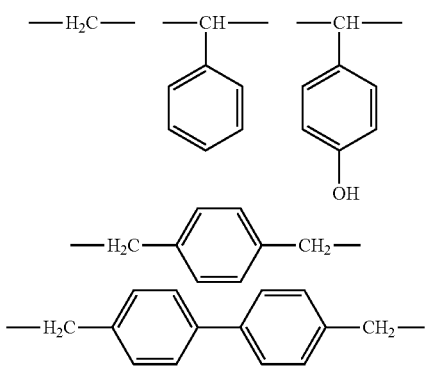

-continued

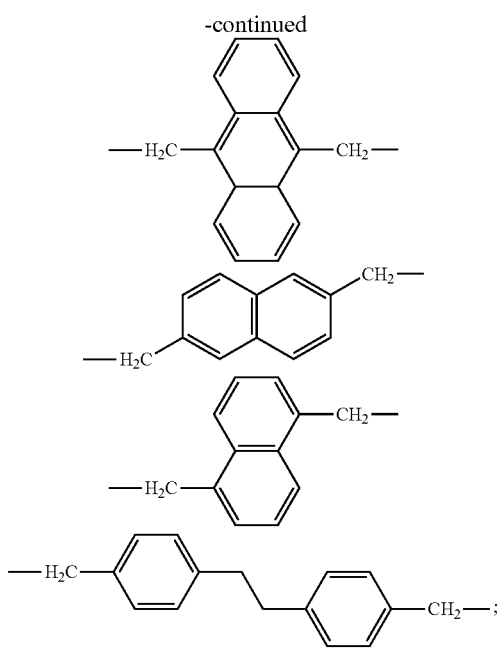

$R_{15}$ is selected from substituted or unsubstituted

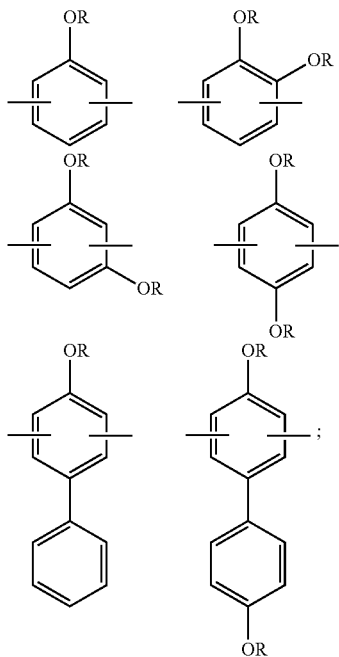

and R in $R_{10}$, $R_{13}$, and $R_{15}$ is each independently hydrogen, a hydroxyl group, a halogen atom, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or a combination thereof, using a CMP slurry composition for polishing organic films having a pH of about 6 or less and comprising a polar solvent and/or non-polar solvent; a metal oxide abrasive comprising silica and/or ceria; and about 0.001 wt % to less than 1wt % of an oxidant comprising a ceric ammonium salt and/or a transition metal chelate.

2. The method according to claim 1, wherein the polishing step comprises polishing the organic film having a film density of about 0.5 g/cm³ to 2.5 g/cm³ and a hardness of about 0.4 GPa or more.

3. The method according to claim 1, wherein the the polishing step comprises polishing the organic film having a film density of about 1.0 g/cm³ to 2.0 g/cm³ and a hardness of about 1.0 GPa or more.

4. The method according to claim 1, wherein the metal oxide abrasive is present in an amount of about 0.1 wt % to 20 wt % in the composition.

5. The method according to claim 1, wherein the CMP slurry composition has a pH of about 5 or less.

6. The method according to claim 1, wherein the transition metal chelate comprises at least one of Fe compounds including propylene diamine tetraacetic acid-Fe, and Mn compounds including propylene diamine tetraacetic acid-Mn.

7. The method according to claim 1, wherein the composition further comprises a pH adjusting agent.

8. The method according to claim 1, wherein the composition further comprises a polishing accelerator comprising malic acid, citric acid, formic acid, glutaric acid, oxalic acid, phthalic acid, succinic acid, tartaric acid, maleic acid, and/or malonic acid.

9. The method according to claim 1, wherein the compound having the substituted aromatic group is substituted with at least one of a functional group represented by Formula A and a functional group represented by Formula B:

*—(O)n-(CH$_2$)m-P(=O)((R)(R')   <Formula A>

*—B(R)(R')   <Formula B> wherein in Formula A and Formula B,
n is 0 or 1,
m is an integer from 0 to 10, and
R, and R' are each independently hydrogen, a hydroxyl group, a substituted or unsubstituted C1 to C20 alkyl group, a substituted or unsubstituted C2 to C20 alkenyl group, a substituted or unsubstituted C3 to C20 cycloalkyl group, a substituted or unsubstituted C1 to C20 haloalkyl group, a substituted or unsubstituted C1 to C20 alkylsulfonate group, a substituted or unsubstituted C1 to C20 alkylsulfonyl group, a substituted or unsubstituted C2 to C20 alkylamide group, a substituted or unsubstituted C3 to C20 alkylester group, a substituted or unsubstituted C2 to C20 cyanoalkyl group, a substituted or unsubstituted C1 to C20 alkoxy group, a substituted or unsubstituted C6 to C30 aryl group, a substituted or unsubstituted C6 to C30 arylalkyl group, or a substituted or unsubstituted C6 to C30 aryloxy group, or R, and R' are linked to each other to form a substituted or unsubstituted C3 to C20 cycloalkyl group or a substituted or unsubstituted C3 to C20 heterocycloalkyl group.

10. The method according to claim 1, wherein the polishing step comprises polishing the organic film formed of the composition including a material represented by Formula 2:

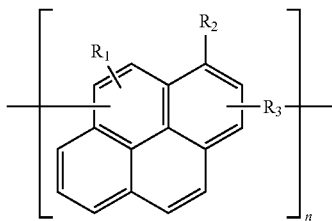

<Formula 2> wherein in Formula 2, n is 1≤n<190;

R$_1$ is hydrogen, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted. C1 to C40 alkylether group, a substituted or unsubstituted C7 to C20 arylalkyleneether group, a substituted or unsubstituted C1 to C30 haloalkyl group, a functional group including P, a functional group including B, or a combination thereof, R$_2$ is hydrogen, an amino group, a substituted or unsubstituted C1 to alkoxy group, a substituted or unsubstituted C6 to C20 aryloxy group, a dialkylamino group —NRR' wherein R and R' are each independently a substituted or unsubstituted C1 to C10 alkyl group or a substituted or unsubstituted C6 to C10 aryl group, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or a combination thereof, and R$_3$ is selected from substituted or unsubstituted

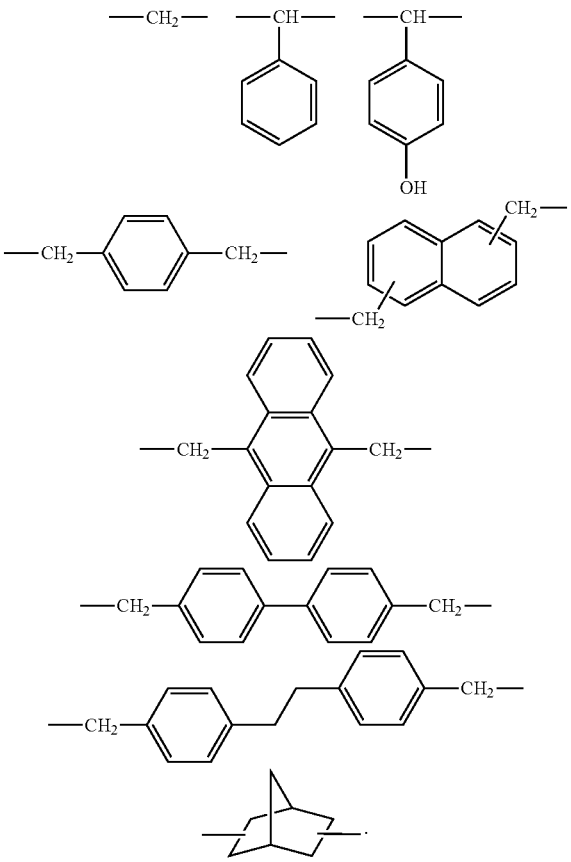

11. The method according to claim 1, wherein the polishing step comprises polishing the organic film formed of the composition including a material represented by Formula 6:

<Formula 6>

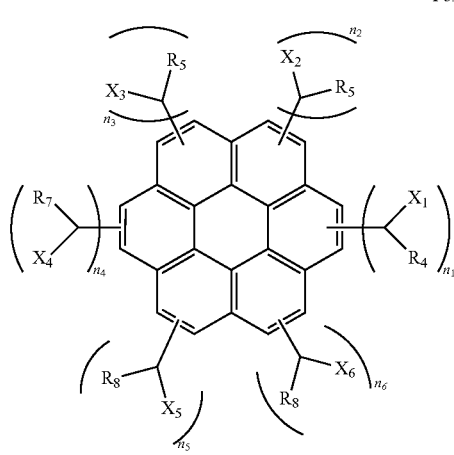

<Formula 7>
<Formula 8>
<Formula 9>

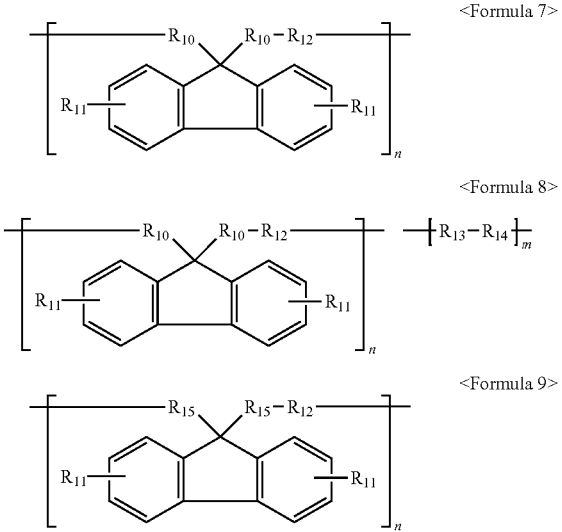

wherein in Formula 6:

R$_4$ to R$_9$ and X$_1$ to X$_6$ are each independently hydrogen, a hydroxyl group, a halogen atom, an allyl group, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C2 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C1 to C30 heteroalkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or a combination thereof, n$_1$ to n$_6$ are each independently 0 to 2, and $2 \leq n_1+n_2+n_3+n_4+n_5+n_6 \leq 6$.

12. The method according to claim 1, wherein the polishing step comprises polishing the organic film formed of the composition including a polymer containing aromatic groups selected from (i) a compound represented by Formula 7, (ii) a mixture of the compound represented by Formula 7 and a compound represented by Formula 8, and/or (iii) a compound represented by Formula 9:

wherein in Formula 7 to Formula 9, m and n are 1≤n<750, 1≤m≤750, 2≤m+n<1500, respectively;

R$_{10}$ is one selected from among substituted or unsubstituted

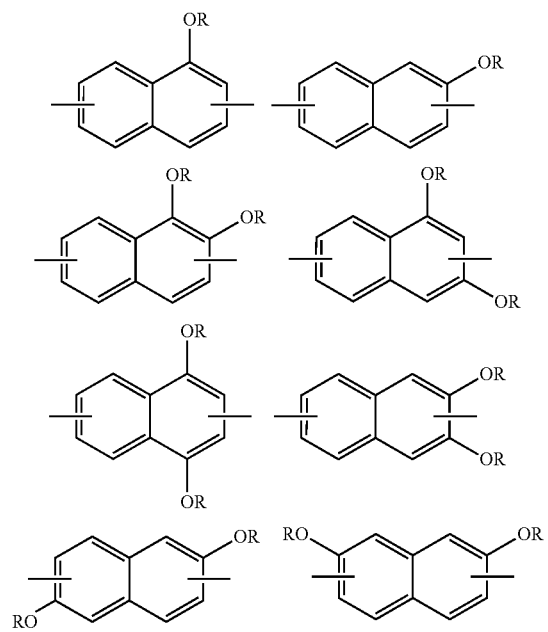

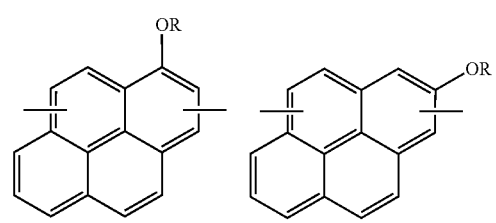

-continued

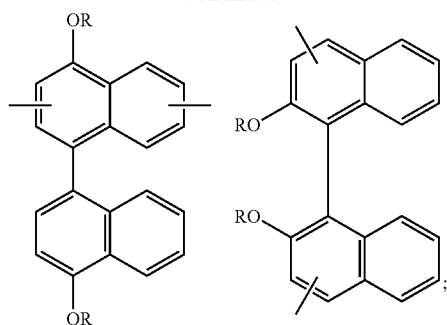

R$_{11}$ is hydrogen, a hydroxyl group, a halogen atom, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 heterocycloalkyl group, a substituted or unsubstituted C3 to C30 cycloalkenyl group, a substituted or unsubstituted C6 to C30 aryl group, a substituted or unsubstituted. C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 aryl alkylene ether group, a substituted or unsubstituted C1 to C30 haloalkyl group, a functional group including P, a functional group including B, or a combination thereof;

R$_{12}$ is one selected from among substituted or unsubstituted

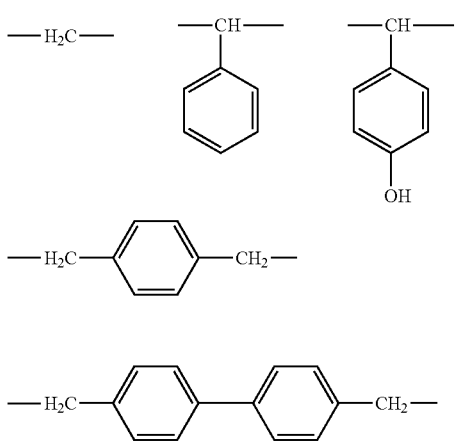

R$_{13}$ is one selected from among substituted or unsubstituted

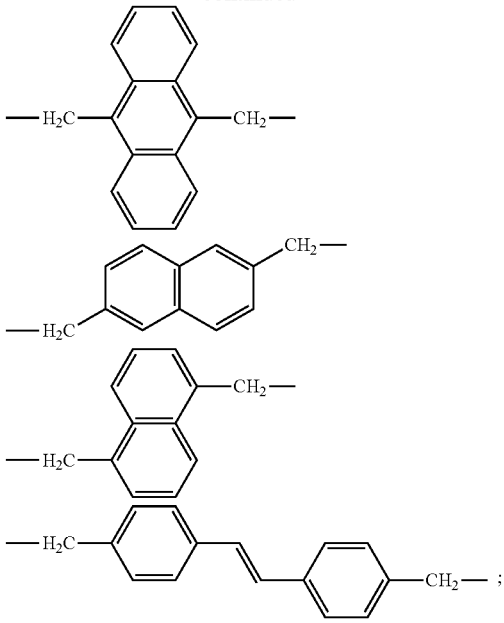

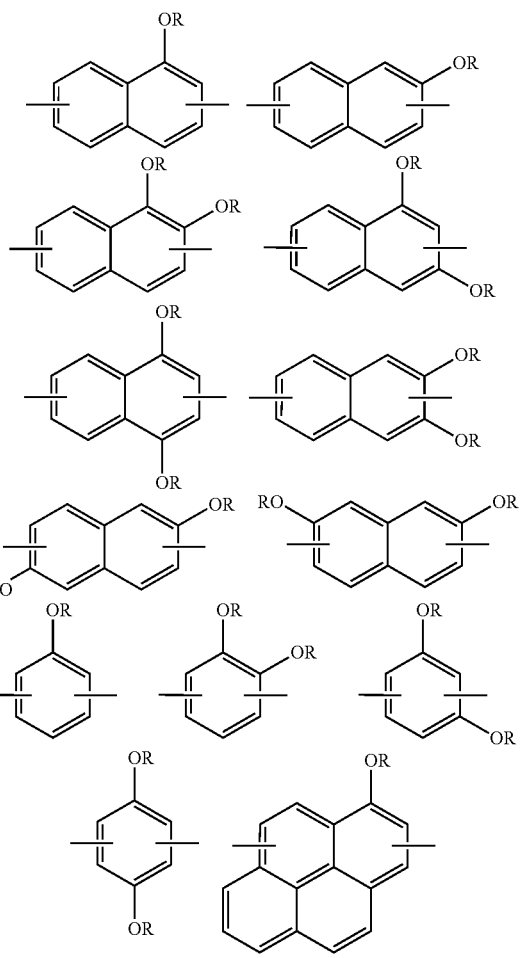

-continued

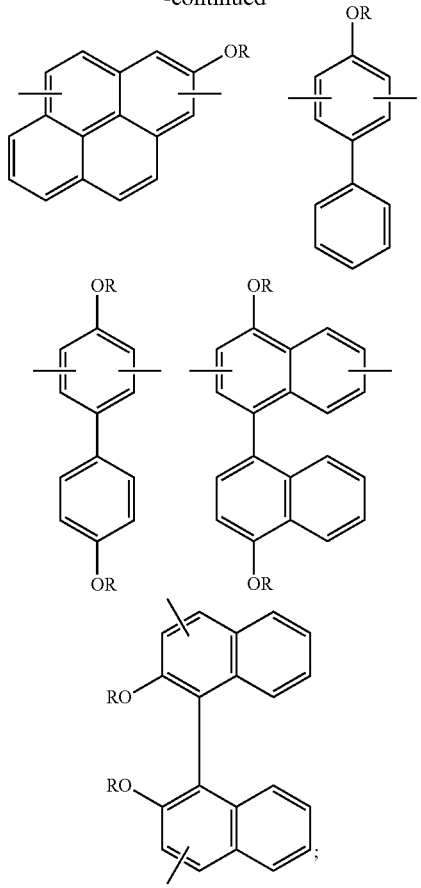

$R_{14}$ is one selected from among substituted or unsubstituted

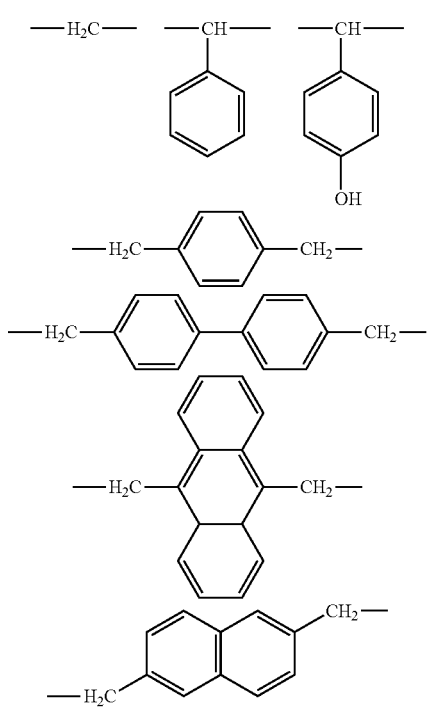

-continued

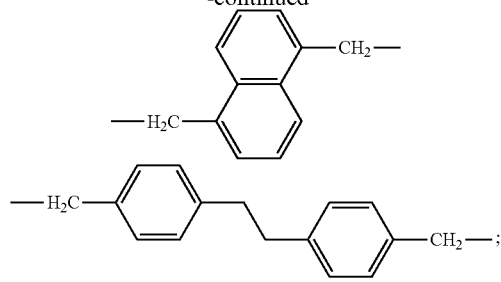

$R_{15}$ is one selected from among substituted or unsubstituted

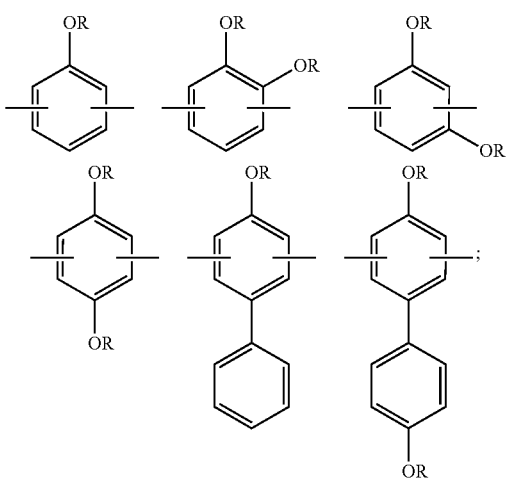

and

R in $R_{10}$, $R_{13}$, and $R_{15}$ is each independently hydrogen, a hydroxyl group halogen atom, a thionyl group, a thiol group, a cyano group, a substituted or unsubstituted amino group, a substituted or unsubstituted C1 to C30 alkyl group, a substituted or unsubstituted C1 to C30 heteroalkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 heterocycloalkyl group, a substituted or unsubstituted C3 to C30 cycloalkenyl group, a substituted or unsubstituted C6 to C30 aryl group, a substituted or unsubstituted C7 to C30 arylalkyl group, a substituted or unsubstituted C1 to C20 heteroalkyl group, a substituted or unsubstituted C2 to C30 heterocycloalkyl group, a substituted or unsubstituted C2 to C30 heterocycloalkenyl group, a substituted or unsubstituted C2 to C30 heteroaryl group, a substituted or unsubstituted C2 to C30 heteroarylalkyl group, a substituted or unsubstituted C1 to C20 alkylamine group, a substituted or unsubstituted C1 to C30 alkoxy group, a substituted or unsubstituted C6 to C30 aryloxy group, a substituted or unsubstituted C1 to C20 aldehyde group, a substituted or unsubstituted C1 to C40 alkylether group, a substituted or unsubstituted C7 to C20 arylalkyleneether group, a substituted or unsubstituted C1 to C30 haloalkyl group, a functional group including P, a functional group including B, or a combination thereof.

13. The method according to claim 1, wherein the polishing step comprises polishing the organic film having an acid value of about 0 mgKOH/g.

14. The method according to claim 1, wherein the CMP slurry composition has a pH of about 4.5 or less.

15. The method according to claim 1, wherein the CMP slurry composition has a pH of about 3 or less.

16. The method according to claim 1, wherein the metal oxide abrasive has an average particle size from about 10 nm to about 150 nm.

17. The method according to claim 1, wherein the oxidant is present in an amount of about 0.001 wt % to about 0.5 wt %.

18. The method according to claim 1, wherein the polishing step comprises polishing the organic film at a polishing rate of about 500 Å/min or more.

19. The method according to claim 18, wherein the polishing step comprises polishing the organic film at a polishing rate of about 1,000 Å/min or more.

20. The method according to claim 18, wherein the polishing step comprises polishing the organic film at a polishing rate of about 500 Å/min to 5000 Å/min.

* * * * *